US011205638B2

United States Patent
Choi

(10) Patent No.: US 11,205,638 B2
(45) Date of Patent: Dec. 21, 2021

(54) STACK PACKAGES INCLUDING AN INTERCONNECTION STRUCTURE

(71) Applicant: SK hynix Inc., Icheon-si Gyeonggi-do (KR)

(72) Inventor: Bok Kyu Choi, Yongin-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 16/689,814

(22) Filed: Nov. 20, 2019

(65) Prior Publication Data
US 2020/0381399 A1 Dec. 3, 2020

(30) Foreign Application Priority Data

May 28, 2019 (KR) .................. 10-2019-0062712

(51) Int. Cl.
*H01L 25/065* (2006.01)
*H01L 23/00* (2006.01)
*H01L 23/50* (2006.01)

(52) U.S. Cl.
CPC .......... *H01L 25/0657* (2013.01); *H01L 23/50* (2013.01); *H01L 24/05* (2013.01); *H01L 24/45* (2013.01); *H01L 2224/48105* (2013.01); *H01L 2225/06506* (2013.01)

(58) Field of Classification Search
None
See application file for complete search history.

(56) References Cited

U.S. PATENT DOCUMENTS

| 8,368,197 | B2 * | 2/2013 | Kook ...................... H01L 24/48 |
| | | | 257/686 |
| 9,478,487 | B2 * | 10/2016 | Yang ................. H01L 23/49838 |
| 9,496,216 | B2 | 11/2016 | Chun et al. |
| 10,249,587 | B1 * | 4/2019 | Chen ....................... H01L 24/11 |
| 10,483,239 | B2 * | 11/2019 | Yan ......................... H01L 24/49 |
| 10,923,462 | B2 * | 2/2021 | Hirano .................... H01L 24/48 |
| 2018/0337161 | A1 * | 11/2018 | Yan ......................... H01L 24/48 |
| 2019/0341375 | A1 * | 11/2019 | Hirano .................. H01L 23/481 |
| 2020/0381401 | A1 * | 12/2020 | Yan ......................... H01L 24/42 |

FOREIGN PATENT DOCUMENTS

KR 1020140028209 A 3/2014

* cited by examiner

*Primary Examiner* — Long Pham
(74) *Attorney, Agent, or Firm* — William Park & Associates Ltd.

(57) ABSTRACT

A stack package includes a package substrate having a bond finger and a stack of a first semiconductor die and a second semiconductor die. The first semiconductor die includes a first pad, a second pad, and a first redistributed line connecting the first and second pads to each other. The second semiconductor die includes a third pad, a fourth pad, and a second redistributed line connecting the third and fourth pads to each other. The first and third pads are connected to each other by a first interconnector which is bonded to the bond finger, and the second and fourth pads are connected to each other by a second interconnector.

23 Claims, 11 Drawing Sheets

STACK PACKAGES INCLUDING AN INTERCONNECTION STRUCTURE

CROSS-REFERENCE TO RELATED APPLICATIONS

The present application claims priority under 35 U.S.C 119(a) to Korean Application No. 10-2019-0062712, filed on May 28, 2019, which is incorporated herein by references in its entirety.

BACKGROUND

1. Technical Field

Embodiments of the present disclosure relate to semiconductor package technologies and, more particularly, to stack packages including an interconnection structure.

2. Related Art

A lot of effort has been focused on development of semiconductor package structures, each of which includes a plurality of semiconductor dies. The plurality of semiconductor dies may be vertically stacked to realize a highly integrated semiconductor package. As the number of semiconductor dies vertically stacked increases, a length of interconnection members for connecting the semiconductor dies to a package substrate may also increase. For example, if the number of the semiconductor dies vertically stacked increases, a length of bonding wires connecting the semiconductor dies to the package substrate may also increase.

SUMMARY

According to an embodiment, a stack package includes a package substrate including a first bond finger, a first semiconductor die disposed on the package substrate, and a second semiconductor die stacked on the first semiconductor die. The first semiconductor die includes a first pad and a second pad which are spaced apart from each other and a first redistributed line connecting the first and second pads to each other, and the second semiconductor die includes a third pad and a fourth pad which are spaced apart from each other and a second redistributed line connecting the third and fourth pads to each other. A first interconnector is disposed to connect the first and third pads to each other and is bonded to the first bond finger. A second interconnector is disposed to connect the second and fourth pads to each other.

According to another embodiment, a stack package includes a package substrate including a first bond finger, a first semiconductor die disposed on the package substrate, and a second semiconductor die stacked on the first semiconductor die. The first semiconductor die includes a first pad and a second pad which are spaced apart from each other, a plurality of ninth pads disposed between the first and second pads, and a first redistributed line detouring the plurality of ninth pads to connect the first and second pads to each other. The second semiconductor die includes a third pad and a fourth pad which are spaced apart from each other, a plurality of tenth pads disposed between the third and fourth pads, and a second redistributed line detouring the plurality of tenth pads to connect the third and fourth pads to each other. A first interconnector is disposed to connect the first and third pads to each other and is bonded to the first bond finger. A second interconnector is disposed to connect the second and fourth pads to each other.

According to yet another embodiment, a stack package includes a package substrate including bond fingers, a plurality of semiconductor dies sequentially stacked on the package substrate, and a plurality of interconnectors disposed to electrically connect the plurality of semiconductor dies to each other and connected to respective ones of the bond fingers. Each of the semiconductor dies includes a plurality of power pads, ground pads disposed between the plurality of power pads, signal pads disposed between the power pads and the ground pads, a power redistributed line connecting the power pads to each other, and a ground redistributed line connecting the ground pads to each other.

According to still another embodiment, a stack package includes a package substrate including bond fingers, a plurality of semiconductor dies sequentially stacked on the package substrate, and a plurality of interconnectors disposed to electrically connect the plurality of semiconductor dies to each other and connected to respective ones of the bond fingers. Each of the semiconductor dies includes a plurality of power pads, ground pads disposed between the plurality of power pads, signal pads disposed between the power pads and the ground pads, a first power redistributed line connecting first power pads among the power pads to each other, a second power redistributed line connecting second power pads among the power pads to each other, and a ground redistributed line connecting the ground pads to each other. The number of the first power pads connected to each other by the first power redistributed line is equal to the number of the second power pads connected to each other by the second power redistributed line.

DETAILED DESCRIPTION

Figure 1:
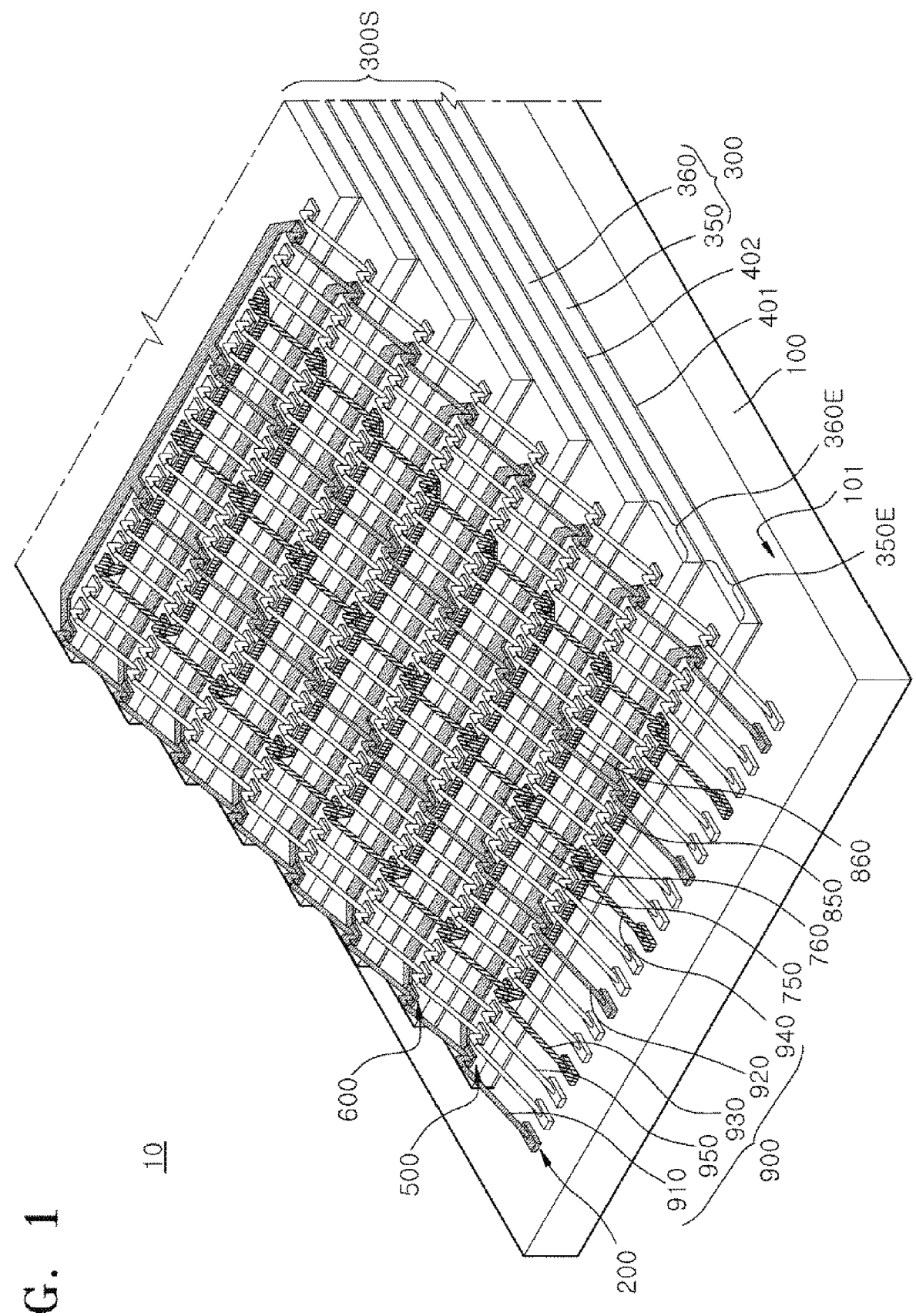
FIG. 1 is a perspective view illustrating a stack package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A stack package may correspond to a semiconductor package, and the semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips, or application specific integrated circuits (ASIC) chips. The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The semiconductor package may be employed in communication systems such as mobile phones, electronic systems associated with biotechnology or health care, or wearable electronic systems. The semiconductor packages may be applicable to internet of things (IoT).

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a perspective view illustrating a stack package 10 according to an embodiment.

Referring to FIG. 1, the stack package 10 may be configured to include a package substrate 100, a stack 300S of semiconductor dies 300, and interconnectors 900. The stack 300S of the semiconductor dies 300 may be disposed on a surface 101 of the package substrate 100. An encapsulant layer (not shown) may be disposed on the surface 101 of the package substrate 100 to cover and protect the stack 300S of the semiconductor dies 300.

The encapsulant layer may be formed of an encapsulant material such as an epoxy molding compound (EMC) material. The package substrate 100 may be configured to include a circuit interconnection structure electrically connecting the semiconductor dies 300 to an external device. For example, the package substrate 100 may be a printed circuit board (PCB), an interposer or the like. In an embodiment, the semiconductor dies 300 may be memory devices.

The semiconductor dies 300 may be vertically stacked to provide a step structure. A first semiconductor die 350 of the semiconductor dies 300 may be attached to the surface 101 of the package substrate 100 by a first adhesive layer 401. A second semiconductor die 360 of the semiconductor dies 300 may be attached to the first semiconductor die 350 by a second adhesive layer 402. The second semiconductor die 360 corresponding to an upper semiconductor die and the first semiconductor die 350 corresponding to a lower semiconductor die. The upper semiconductor die may be stacked on the lower semiconductor die to be laterally offset relative to the lower semiconductor die, thereby revealing an edge region (i.e. 350E for the first semiconductor die 350) of the lower semiconductor die. As such, the plurality of semiconductor dies 300 may be sequentially stacked to be laterally offset to provide a step structure and to constitute the stack 300S. Although FIG. 1 illustrates an example in which the number of the stacked semiconductor dies 300 is eight, the present disclosure is not limited thereto. For example, in some other embodiments, the number of the stacked semiconductor dies 300 may be less or greater than eight. The semiconductor dies 300 may have the same shape or the same function. Alternatively, the semiconductor dies 300 may have different shapes or different functions.

The interconnectors 900 may be connection members electrically connecting the semiconductor dies 300 to the package substrate 100. For example, the interconnectors 900 may be bonding wires. The package substrate 100 may include a plurality of bond fingers 200 disposed on the surface 101. The interconnectors 900 may be bonded and connected to the bond fingers 200, respectively.

Each of the semiconductor dies 300 may include conductive pads disposed on a surface thereof. For example, the first semiconductor die 350 may include a plurality of conductive pads 500 disposed on the edge region 350E. Similarly, the second semiconductor die 360 may include a plurality of conductive pads 600 disposed on an edge region 360E of the second semiconductor die 360. The interconnectors 900 may electrically connect the bond fingers 200 to the conductive pads 500 of the first semiconductor die 350 and may extend to electrically connect the conductive pads 500 of the first semiconductor die 350 to the conductive pads 600 of the second semiconductor die 360. The interconnectors 900 may further extend to electrically connect the second semiconductor die 360 to the semiconductor dies 300 stacked on the second semiconductor die 360.

Each of the semiconductor dies 300 may include redistributed lines that are disposed on a surface thereof to electrically connect some of its conductive pads to each other. For example, the first semiconductor die 350 may include a first redistributed line 750 and a third redistributed line 850 that are disposed on the edge region 350E to electrically connect some of the conductive pads 500 to each other. Similarly, the second semiconductor die 360 may include a second redistributed line 760 and a fourth redistributed line 860 that are disposed on the edge region 360E to electrically connect some of the conductive pads 600 to each other.

Figure 2:
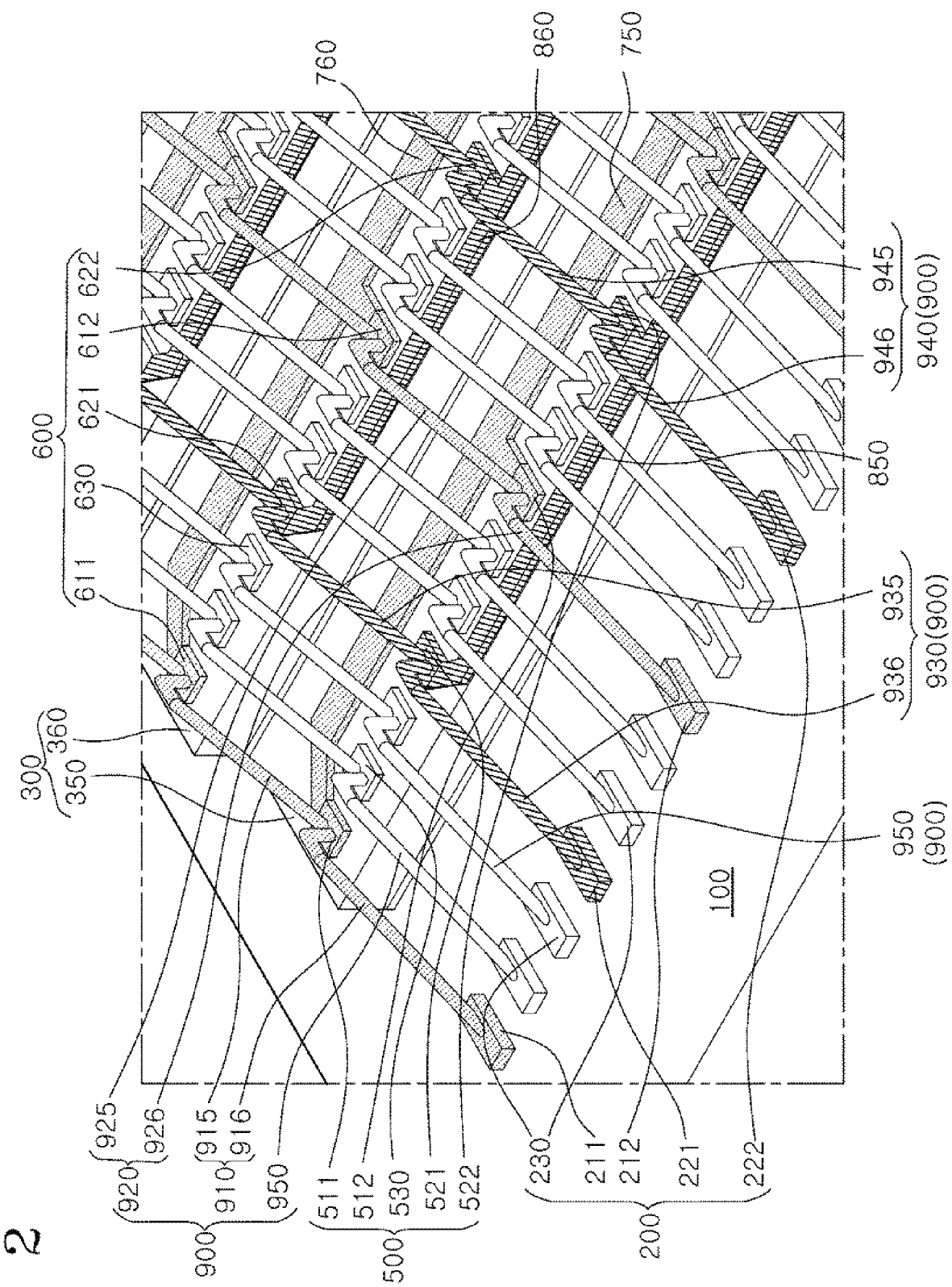
FIG. 2 is an enlarged view illustrating a portion of the stack package shown in FIG. 1.
Figure 3:
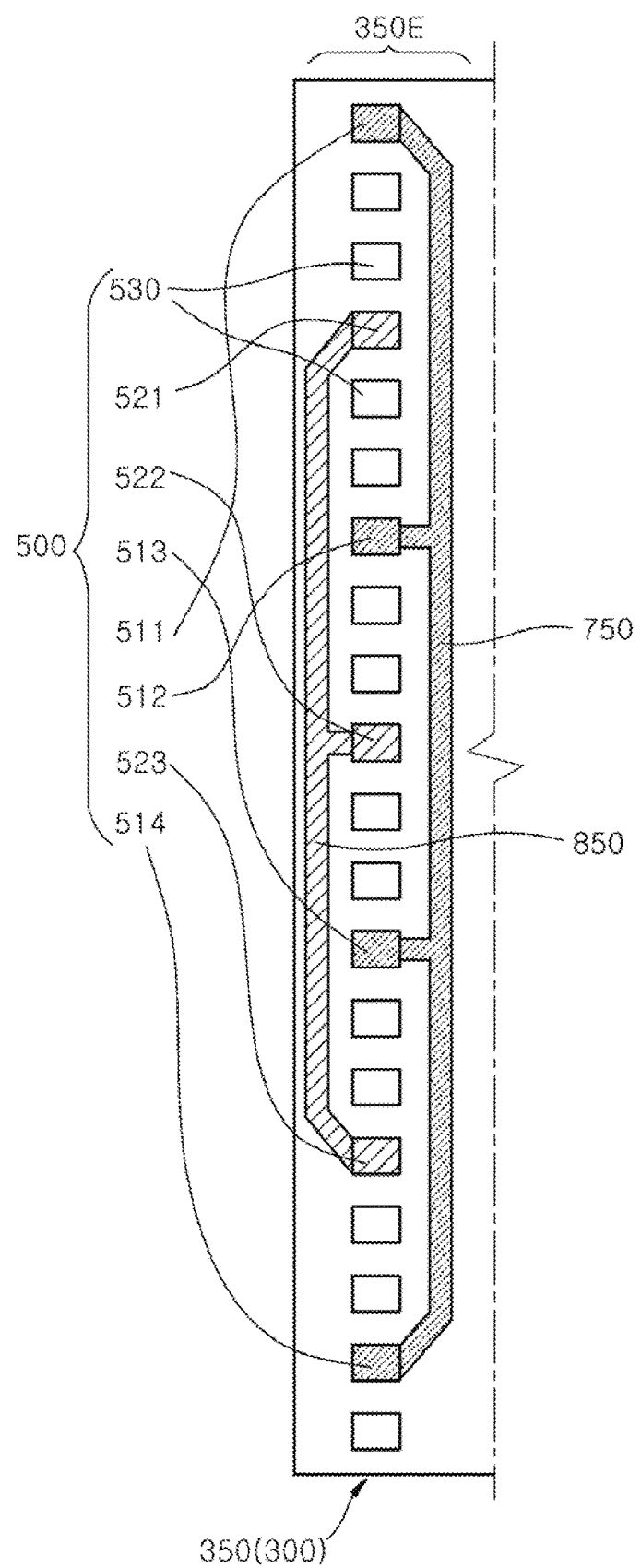
FIG. 3 is a plan view illustrating an edge region of a first semiconductor die included in the stack package of FIG. 1.
Figure 4:
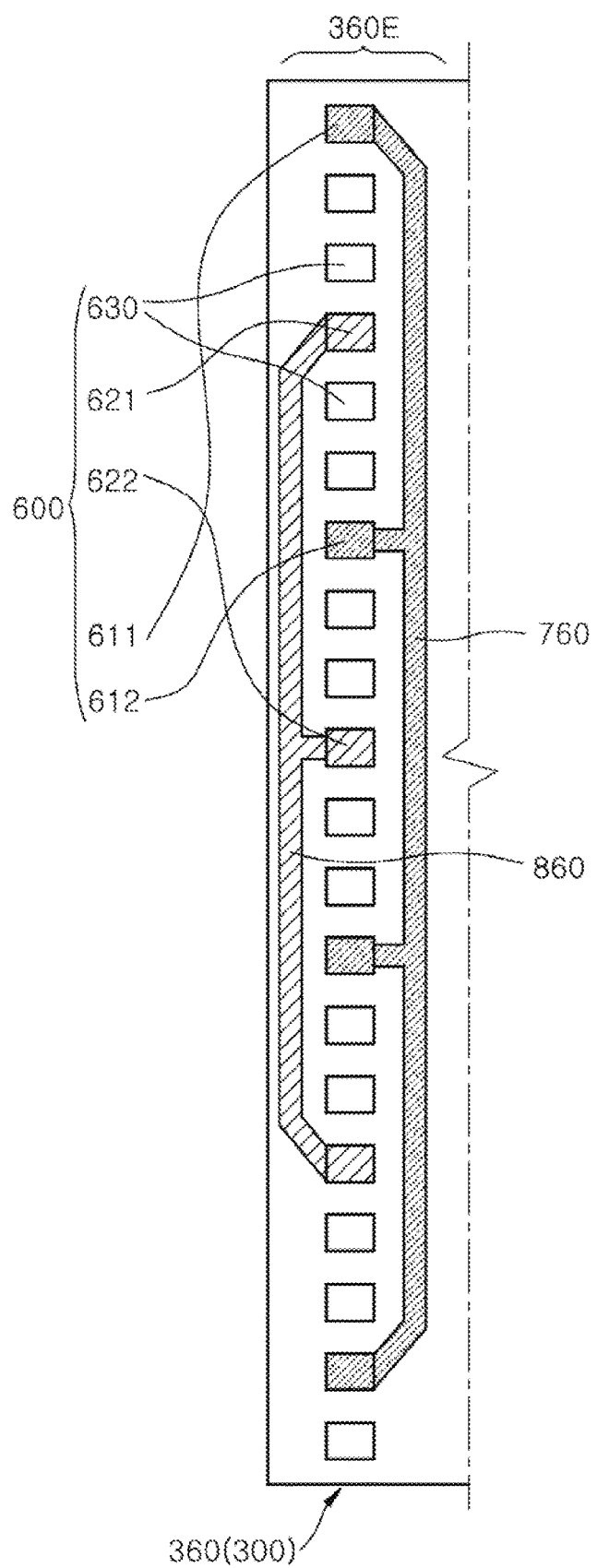
FIG. 4 is a plan view illustrating an edge region of a second semiconductor die included in the stack package of FIG. 1.

FIG. 2 is an enlarged view illustrating a portion of the stack package 10 shown in FIG. 1. FIG. 3 is a plan view illustrating the edge region 350E of the first semiconductor die 350 included in the stack package 10 of FIG. 1. FIG. 4 is a plan view illustrating the edge region 360E of the second semiconductor die 360 included in the stack package 10 of FIG. 1.

Referring to FIGS. 2 and 3, the first semiconductor die 350 may include a first pad 511 and a second pad 512 corresponding to some of the conductive pads 500. The first pad 511 and the second pad 512 may be disposed to be spaced apart from each other. The first redistributed line 750 may be disposed on a surface of the first semiconductor die 350 to electrically connect the first pad 511 to the second pad 512. The first and second pads 511 and 512 may be terminals for supplying electric power (e.g., a power supply voltage) to the first semiconductor die 350. The conductive pads 500 may include additional pads 513 and 514. The first redistributed line 750 may extend to electrically connect the second pad 512 to the additional pads 513 and 514. As described above, the first redistributed line 750 may extend to electrically connect three or more pads of the conductive pads 500 to each other.

Referring to FIGS. 2 and 4, the second semiconductor die 360 may include a third pad 611 and a fourth pad 612 corresponding to some of the conductive pads 600. The third pad 611 and the fourth pad 612 may be disposed to be spaced apart from each other. The second redistributed line 760 may be disposed on a surface of the second semiconductor die 360 to electrically connect the third pad 611 to the fourth pad 612. The third and fourth pads 611 and 612 may be terminals for supplying electric power (e.g., a power supply voltage) to the second semiconductor die 360.

Referring to FIG. 2, a first interconnector 910 corresponding to one of the interconnectors 900 may be electrically connected to a first bond finger 211 corresponding to one of the bond fingers 200 of the package substrate 100. The first interconnector 910 may include a first sub-portion 915 electrically connecting the first pad 511 of the first semiconductor die 350 to the third pad 611 of the second semiconductor die 360.

The first interconnector 910 may further include a second sub-portion 916 that extends from the first sub-portion 915 to electrically connect the first pad 511 to the first bond finger 211. The first interconnector 910 may be a bonding wire that electrically connects the first and third pads 511 and 611 to each other and is bonded to the first bond finger 211. The first interconnector 910 may further extend to be electrically connected to the semiconductor dies 300 stacked on the second semiconductor die 360, as illustrated in FIG. 1.

A second interconnector 920 corresponding to another one of the interconnectors 900 may be disposed to be spaced apart from the first interconnector 910. The second interconnector 920 may include a first sub-portion 925 electrically connecting the second pad 512 of the first semiconductor die 350 to the fourth pad 612 of the second semiconductor die 360.

The second interconnector 920 may further include a second sub-portion 926 that extends from the first sub-portion 925 to electrically connect the second pad 512 to a second bond finger 212. The second bond finger 212 may be one of the bond fingers 200 and may be disposed to be spaced apart from the first bond finger 211. The second interconnector 920 may be a bonding wire that electrically connects the second and fourth pads 512 and 612 to each other and is bonded to the second bond finger 212. The second interconnector 920 may further extend to be electrically connected to the semiconductor dies 300 stacked on the second semiconductor die 360, as illustrated in FIG. 1.

Referring again to FIG. 3, the conductive pads 500 of the first semiconductor die 350 may further include a fifth pad 521 and a sixth pad 522. The fifth pad 521 and the sixth pad 522 may be disposed to be spaced apart from each other. The fifth pad 521 may be disposed between the first pad 511 and the second pad 512. The sixth pad 522 may be located at a side of the second pad 512 opposite to the fifth pad 521. The third redistributed line 850 may be disposed to electrically connect the fifth pad 521 to the sixth pad 522. The fifth pad 521 and the sixth pad 522 may be terminals for supplying a ground voltage to the first semiconductor die 350.

An additional pad 523 included in the conductive pads 500 may be disposed to act as another ground terminal. The additional pad 523 may be disposed to be spaced apart from the sixth pad 522. The third redistributed line 850 may further extend to electrically connect the sixth pad 522 to the additional pad 523. As described above, the third redistributed line 850 may extend to electrically connect three or more pads of the conductive pads 500 to each other.

Referring again to FIG. 4, the conductive pads 600 of the second semiconductor die 360 may further include a seventh pad 621 and an eighth pad 622. The seventh pad 621 and the eighth pad 622 may be disposed to be spaced apart from each other. The seventh pad 621 may be disposed between the third pad 611 and the fourth pad 612. The eighth pad 622 may be located at a side of the fourth pad 612 opposite to the seventh pad 621. The fourth redistributed line 860 may be disposed to electrically connect the seventh pad 621 to the eighth pad 622. The seventh pad 621 and the eighth pad 622 may be terminals for supplying a ground voltage to the second semiconductor die 360.

Referring again to FIG. 2, a third interconnector 930 corresponding to another one of the interconnectors 900 may be disposed between the first interconnector 910 and the second interconnector 920. The third interconnector 930 may include a fifth sub-portion 935 electrically connecting the fifth pad 521 of the first semiconductor die 350 to the seventh pad 621 of the second semiconductor die 360.

The third interconnector 930 may further include a sixth sub-portion 936 that extends from the fifth sub-portion 935 to electrically connect the fifth pad 521 to a third bond finger 221. The third bond finger 221 may be one of the bond fingers 200 and may be disposed between the first bond finger 211 and the second bond finger 212. The third interconnector 930 may be a bonding wire that electrically connects the fifth and seventh pads 521 and 621 to each other and is bonded to the third bond finger 221.

A fourth interconnector 940 corresponding to another one of the interconnectors 900 may be disposed at a side of the second interconnector 920 opposite to the third interconnector 930. The fourth interconnector 940 may include a seventh sub-portion 945 electrically connecting the sixth pad 522 of the first semiconductor die 350 to the eighth pad 622 of the second semiconductor die 360.

The fourth interconnector 940 may further include an eighth sub-portion 946 that extends from the seventh sub-portion 945 to electrically connect the sixth pad 522 to a fourth bond finger 222. The fourth bond finger 222 may be one of the bond fingers 200 and may be disposed at a side of the second bond finger 212 opposite to the third bond finger 221. The fourth interconnector 940 may be a bonding wire that electrically connects the sixth and eighth pads 522 and 622 to each other and is bonded to the fourth bond finger 222.

The third and fourth interconnectors 930 and 940 may be ground interconnectors that supply a ground voltage to the first and second semiconductor dies 350 and 360. The first and second interconnectors 910 and 920 may be power interconnectors that supply a power supply voltage to the first and second semiconductor dies 350 and 360.

Referring again to FIG. 3, the conductive pads 500 of the first semiconductor die 350 may further include a plurality of ninth pads 530. Some of the ninth pads 530 may be disposed between the first pad 511 and the second pad 512. Some of the ninth pads 530 may be disposed between the second pad 512 and the fifth pad 521. The fifth pad 521 may be disposed between two of the ninth pads 530.

In an embodiment, the first redistributed line 750 may circumvent the ninth pads 530 and the fifth pad 521 to extend. The third redistributed line 850 may circumvent the ninth pads 530 and the second pad 512 to extend. The third redistributed line 850 may be located at one side of some of the ninth pads 530 opposite to the first redistributed line 750. Accordingly, the first redistributed line 750 and the third redistributed line 850 may be electrically isolated from each other. In an embodiment the first redistributed line 750 and the third redistributed line 850 may be without any contact or connection with each other.

Referring again to FIG. 4, the conductive pads 600 of the second semiconductor die 360 may further include a plurality of tenth pads 630. Some of the tenth pads 630 may be disposed between the third pad 611 and the fourth pad 612. Some of the tenth pads 630 may be disposed between the fourth pad 612 and the seventh pad 621. The seventh pad 621 may be disposed between two of the tenth pads 630. The second redistributed line 760 may circumvent the tenth pads 630 and the seventh pad 621 to extend. The fourth redistributed line 860 may circumvent the tenth pads 630 and the fourth pad 612 to extend. The fourth redistributed line 860 may be located at one side of some of the tenth pads 630 opposite to the second redistributed line 760. Accordingly, the second redistributed line 760 and the fourth redistributed line 860 may be electrically isolated from each other. In an embodiment, the second redistributed line 760 and the fourth redistributed line 860 may be without any contact or connection with each other.

Referring again to FIG. 2, one of fifth interconnectors 950 corresponding to some of the interconnectors 900 may be disposed between the first interconnector 910 and the third interconnector 930 or between the third interconnector 930 and the second interconnector 920. The fifth interconnectors 950 may be bonding wires that electrically connect the ninth pads 530 of the first semiconductor die 350 to the tenth pads 630 of the second semiconductor die 360. The fifth interconnectors 950 may extend to electrically connect the ninth and tenth pads 530 and 630 to fifth bond fingers 230 of the package substrate 100.

The fifth bond fingers 230 may be disposed between the first bond finger 211 and the third bond finger 221 or between the second bond finger 212 and the third bond finger 221. The third bond finger 221 may be disposed between two of the fifth bond fingers 230 located between the first bond finger 211 and the second bond finger 212. The ninth pads 530 may be terminals for applying data signals to the first semiconductor die 350, and the tenth pads 630 may be terminals for applying the data signals to the second semiconductor die 360.

Figure 5:
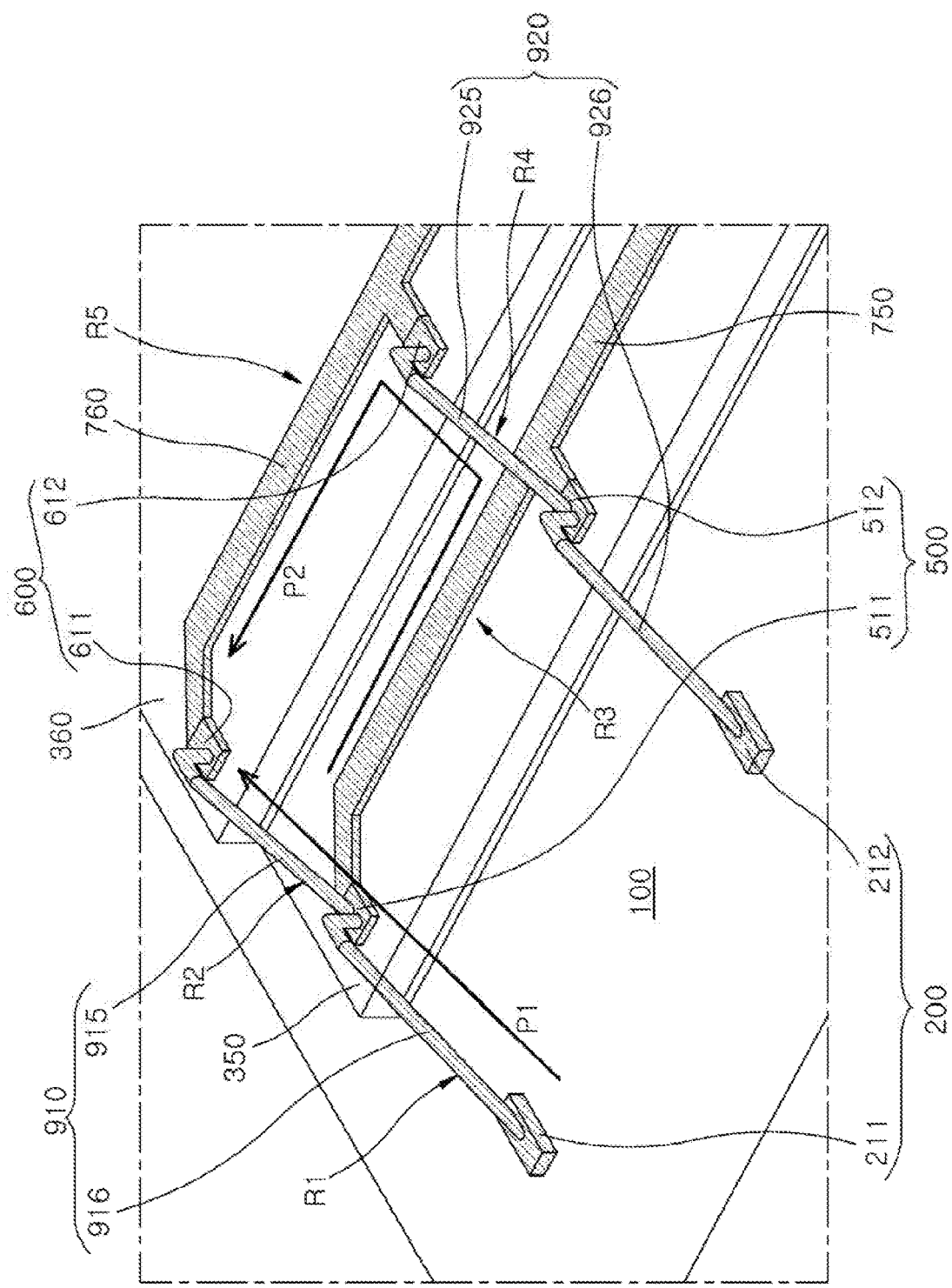
FIG. 5 is a perspective view illustrating an interconnection structure of a stack package according to an embodiment.
Figure 6:
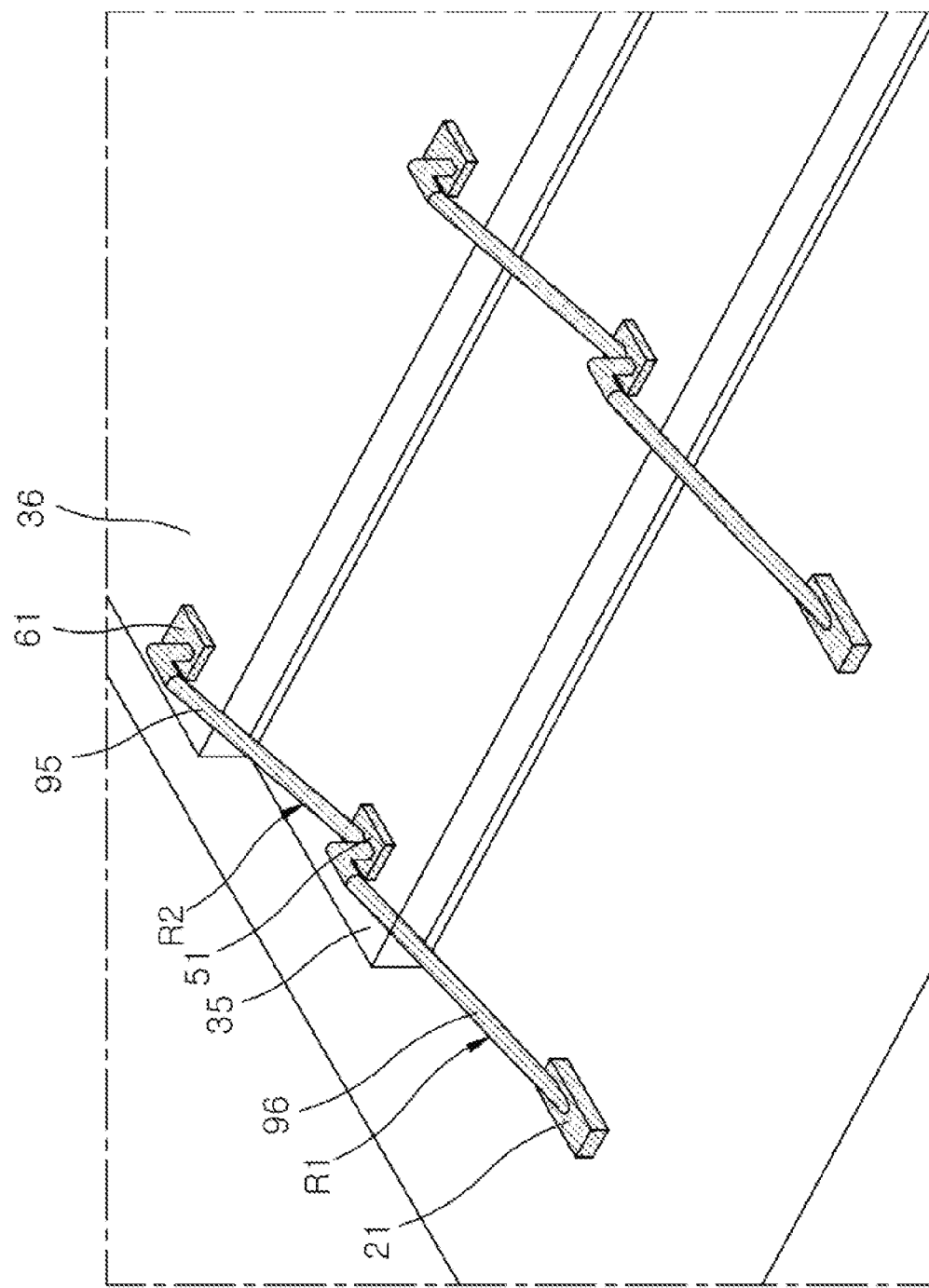
FIG. 6 is a perspective view illustrating an interconnection structure of a stack package according to an example.

FIG. 5 is a perspective view illustrating a portion of an interconnection structure comprised of the interconnectors 900 included in the stack package 10 of FIG. 1, and FIG. 6 is a perspective view illustrating an interconnection structure of a stack package 12 according to an example. FIG. 5 illustrates an electrical path between the first bond finger 211 of the package substrate 100 and the third pad 611 of the second semiconductor die 360, which are shown in FIG. 2. The comparative example illustrated in FIG. 6 may correspond to an example in which the first and second redistributed lines 750 and 760 of FIG. 5 are excluded.

Referring to FIG. 5, the electrical path between the first bond finger 211 of the package substrate 100 and the third pad 611 of the second semiconductor die 360 may include a first path P1 directly connecting the first bond finger 211 to the third pad 611 and a second path P2 branched from the first path P1 to be connected in parallel with the first sub-portion 915 of the first interconnector 910. The first path P1 may be a path including the second sub-portion 916 and the first sub-portion 915 of the first interconnector 910. The second path P2 may be a path including a portion of the first redistributed line 750 connecting the first pad 511 to the second pad 512, the first sub-portion 925 of the second interconnector 920, and a portion of the second redistributed line 760 connecting the third pad 611 to the fourth pad 612. A total resistance value R_total of the electrical path between the first bond finger 211 of the package substrate 100 and the third pad 611 of the second semiconductor die 360 may be expressed by a resistance value of the first path P1 and a resistance value of the second path P2.

If a resistance value of the second sub-portion 916 of the first interconnector 910 is "R1" and a resistance value of the first sub-portion 915 of the first interconnector 910 is "R2", a resistance value of the first path P1 may be expressed by an equation of "R1+R2". If a resistance value of a portion of the first redistributed line 750 connecting the first pad 511 to the second pad 512 is "R3", a resistance value of the first sub-portion 925 of the second interconnector 920 is "R4", and a resistance value of a portion of the second redistributed line 760 connecting the third pad 611 to the fourth pad 612 is "R5", a resistance value of the second path P2 may be expressed by an equation of "R3+R4+R5". The total resistance value R_total of the electrical path between the first bond finger 211 of the package substrate 100 and the third pad 611 of the second semiconductor die 360 may be expressed by an equation of "R1+R2×(R3+R4+R5)/(R2+R3+R4+R5)". As such, the total resistance value R_total may be less than the resistance value of the first path P1. If another path is additionally connected in parallel with the second path P2, the total resistance value R_total may be reduced even more. That is, if the number of electrical paths connected in parallel with the first sub-portion 915 of the first interconnector 910 increases, the total resistance value R_total may be reduced.

Referring to FIG. 6, for example, an electrical path between a first bond finger 21 of a package substrate and a third pad 61 of a second semiconductor die 36 may include a second sub-portion 96 of an interconnector connecting the first bond finger 21 to a first pad 51 of a first semiconductor die 35 and a first sub-portion 95 of the interconnector connecting the first pad 51 of the first semiconductor die 35 to the third pad 61 of the second semiconductor die 36. In such a case, if a resistance value of the second sub-portion 96 is "R1" and a resistance value of the first sub-portion 95 is "R2", a total resistance value of the electrical path between the first bond finger 21 and the third pad 61 may be expressed by an equation of "R1+R2". In order to clearly and correctly compare the total resistance value R_total shown in FIG. 5 with the total resistance value shown in FIG. 6, it may be assumed that the second sub-portion 96 has the same resistance value (i.e., "R1") as the second sub-portion 916 shown in FIG. 5 and the first sub-portion 95 has the same resistance value (i.e., "R2") as the first sub-portion 915 shown in FIG. 5. As a result, the electrical path between the first bond finger 21 and the third pad 61 may have a relatively higher resistance value as compared with the electrical path between the first bond finger 211 and the third pad 611 illustrated in FIG. 5.

According to an embodiment, the first redistributed line 750 connecting the first pad 511 to the second pad 512, the first sub-portion 925 of the second interconnector 920, and the second redistributed line 760 connecting the third pad 611 to the fourth pad 612 are disposed to constitute a shunt resistor of the first sub-portion 915. Thus, the total resistance value R_total of the electrical path between the first bond finger 211 of the package substrate 100 and the third pad 611 of the second semiconductor die 360 may be reduced due to the presence of the first redistributed line 750 connecting the first pad 511 to the second pad 512, the first sub-portion 925 of the second interconnector 920, and the second redistributed line 760 connecting the third pad 611 to the fourth pad 612. This resistance reduction effect may be valid even in case that additional semiconductor dies are stacked on the second semiconductor die 360. The resistance reduction effect may lead to reducing an inductance value of the electrical path. In addition, the resistance reduction effect may lead to reducing an impedance value of the electrical path. Accordingly, the stack package 10 may exhibit an excellent characteristic in terms of noise.

Figure 7:
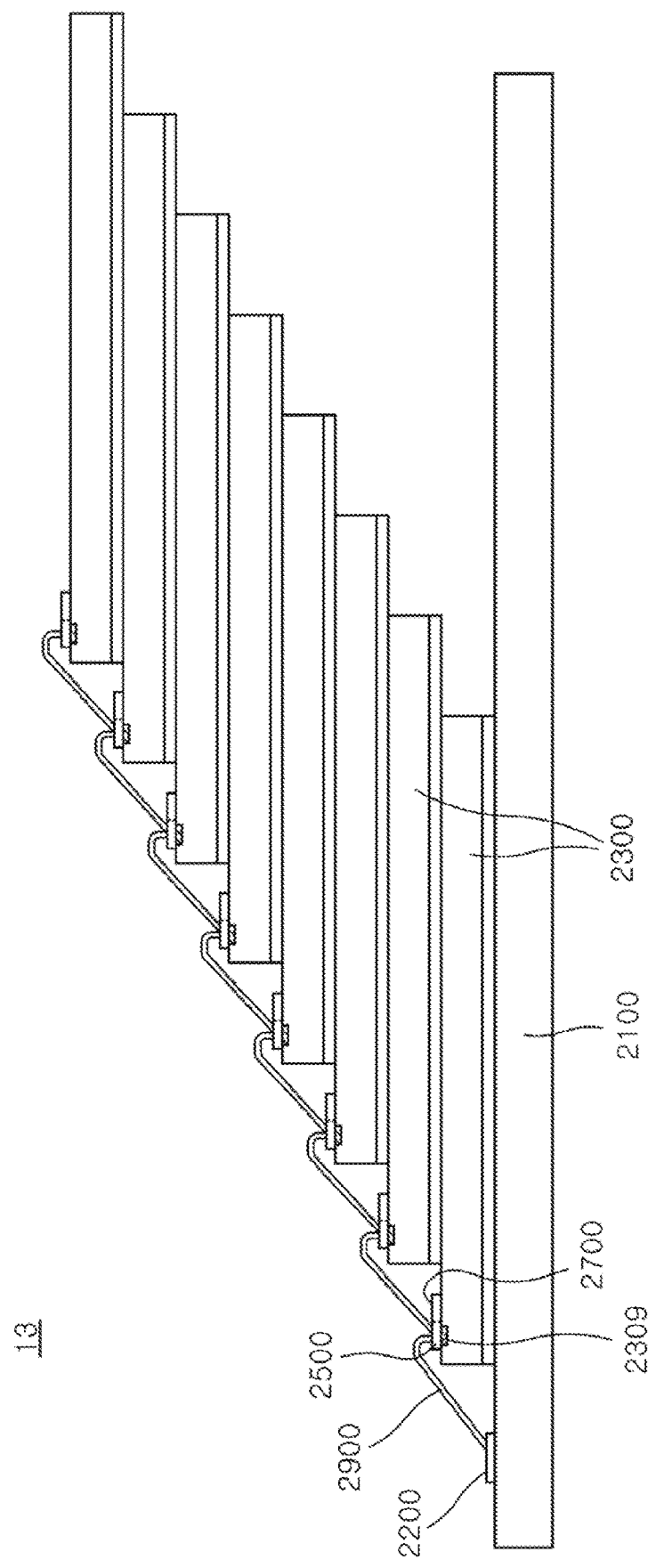
FIG. 7 is a cross-sectional view illustrating a stack package according to an embodiment.
Figure 8:
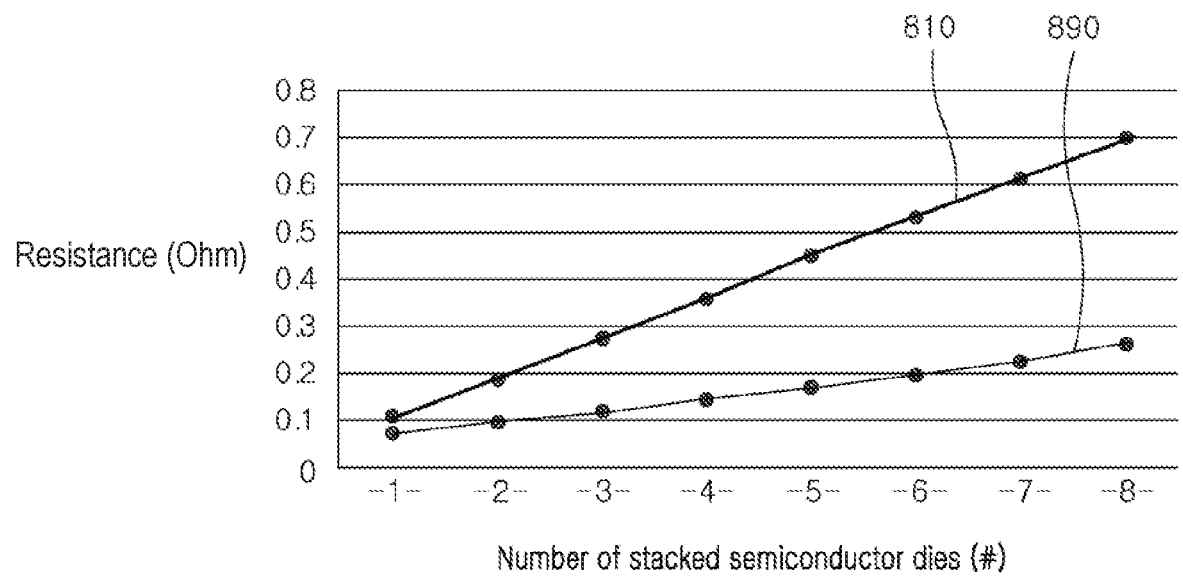
FIG. 8 is a graph illustrating a resistance reduction effect of a stack package according to an embodiment.
Figure 9:
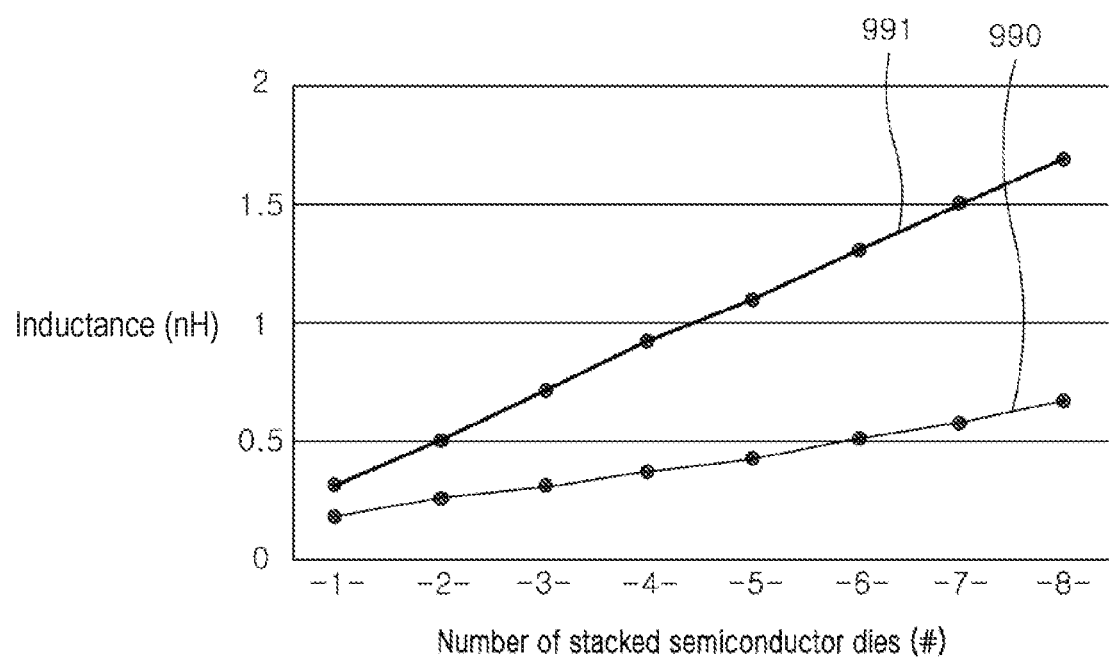
FIG. 9 is a graph illustrating an inductance reduction effect of a stack package according to an embodiment.

FIG. 7 is a cross-sectional view illustrating a stack package 13 according to an embodiment. FIG. 8 is a graph illustrating a resistance reduction effect of the stack package 13 shown in FIG. 7. FIG. 9 is a graph illustrating an inductance reduction effect of the stack package 13 shown in FIG. 7.

FIG. 7 illustrates the stack package 13 including semiconductor dies 2300 vertically stacked on a package substrate 2100. The stack package 13 of FIG. 7 may correspond to an example in which the number of the semiconductor dies 2300 is eight and the semiconductor dies 2300 are stacked to provide a step structure. Each of the semiconductor dies 2300 may include die pads 2309, conductive pads 2500 disposed on the die pads 2309, and a redistributed line 2700 connecting some of the conductive pads 2500 to each other. Interconnectors 2900 may extend from bond fingers 2200 of the package substrate 2100 to reach an uppermost die of the semiconductor dies 2300 such that the semiconductor dies 2300 are electrically connected to the package substrate 2100.

Resistance values of various electrical paths between the bond finger 2200 of the package substrate 2100 and the conductive pads 2500 included in the semiconductor dies 2300 illustrated in FIG. 7 are plotted by a line 890 in FIG. 8. In FIG. 8, data indicated by a line 810 denote resistance values of various electrical paths in a stack package without the redistributed lines 2700 according to an example similar to FIG. 6. In FIG. 8, the abscissa represents the number of semiconductor dies 2300 vertically stacked on the package substrate 2100, and the ordinate represents a resistance value of an electrical path between the bond finger 2200 of the package substrate 2100 and the conductive pad 2500 included in each of the stacked semiconductor dies 2300. For example, the resistance value when the number of the stacked semiconductor dies 2300 is "4" denotes a resistance value of an electrical path between the bond finger 2200 of the package substrate 2100 and the conductive pad 2500 of the fourth semiconductor die 2300. As illustrated in FIG. 8, the resistance values on the line 890 were lower than the resistance values on the line 810. In addition, a slope of the line 890 indicating the resistance values between the bond finger 2200 of the package substrate 2100 and the conductive pads 2500 included in the stacked semiconductor dies 2300 was lower than a slope of the line 810 indicating the resistance values of the example similar to FIG. 6. As such, the resistance reduction effect of the stack package according to an embodiment of the present disclosure may be obtained even though the number of semiconductor dies stacked on a package substrate increases.

Inductance values of the various electrical paths between the bond finger 2200 of the package substrate 2100 and the conductive pads 2500 included in the semiconductor dies 2300 are plotted by a line 990 in FIG. 9. In FIG. 9, data indicated by a line 991 denote inductance values of the various electrical paths in the stack package without the redistributed lines 2700 according to an example similar to FIG. 6. In FIG. 9, the abscissa represents the number of semiconductor dies 2300 vertically stacked on the package substrate 2100, and the ordinate represents an inductance value of an electrical path between the bond finger 2200 of the package substrate 2100 and the conductive pad 2500 included in the stacked semiconductor dies 2300. For example, the inductance value when the number of the stacked semiconductor dies 2300 is "4" denotes an inductance value of an electrical path between the bond finger 2200 of the package substrate 2100 and the conductive pad 2500 of the fourth semiconductor die 2300. As illustrated in FIG. 9, the inductance values on the line 990 were lower than the resistance values on the line 991. In addition, a slope of the line 990 indicating the inductance values between the bond finger 2200 of the package substrate 2100 and the conductive pads 2500 included in the stacked semiconductor dies 2300 was lower than a slope of the line 991 indicating the inductance values of the example similar to FIG. 6. As such, the inductance reduction effect of the stack package according to an embodiment of the present disclosure may be obtained even though the number of semiconductor dies stacked on a package substrate increases.

If a length of a wire corresponding to the interconnector extending from the bond finger of the package substrate to an uppermost die of the stacked semiconductor dies increases as the number of the stacked semiconductor dies increases, the resistance value and the inductance value illustrated in FIGS. 8 and 9 may also increase. This increase of the resistance value and the inductance value of the interconnector may cause severe switching noise when the stacked semiconductor dies operate. According to an embodiment, even though the number of the stacked semiconductor dies increases, the resistance value and the inductance value of the electrical paths between the package substrate and the semiconductor dies may increase at a more gradual rate because of the presence of the redistributed lines as compared with the example related or similar to FIG. 6 without the redistributed lines. As a result, it may be possible to reduce the noise in the stack package.

Referring again to FIG. 4, when the third pad 611 and the fourth pad 612 corresponding to power pads (or power terminals) for supplying a power supply voltage to the second semiconductor die 360 are electrically connected to each other by the second redistributed line 760, substantially the same power delivery network (PDN) condition may be provided for all of the power pads.

As described above, if the plurality of power pads for supplying the power supply voltage to the second semiconductor die 360 are electrically connected to each other to have substantially the same potential, a timing skew of digital signals transmitted through the tenth pads 630 corresponding to input/output (I/O) pads may be relatively reduced when a level transition of the digital signals occurs from a logic "low" level into a logic "high" level. That is, when a level of the digital signals transmitted through the tenth pads 630 is changed from a logic "low" level into a logic "high" level, a relatively low PDN impedance condition may be provided to the power pads.

Thus, a switching noise and an I/O switch delay time of the semiconductor dies may be reduced. Because similar or substantially the same PDN condition is provided to the power pads, the I/O signals transmitted through the tenth pads 630 may have substantially the same delay time. Accordingly, a timing skew between the I/O signals may be reduced. As such, when a level of the I/O signals is changed from a logic "low" level into a logic "high" level, a switching delay time of the I/O signals may be minimized by supplying a power supply voltage to the second semiconductor die 360 through the plurality of power pads (i.e., the third and fourth pads 611 and 612) electrically connected to each other by the second redistributed line 760.

When the seventh pad 621 and the eighth pad 622 corresponding to ground pads (or ground terminals) for supplying a ground voltage to the second semiconductor die 360 are electrically connected to each other by the fourth redistributed line 860, a timing skew of digital signals transmitted through the tenth pads 630 corresponding to input/output (I/O) pads may be relatively reduced when a level transition of the digital signals occurs from a logic "high" level into a logic "low" level. That is, when a level of the digital signals transmitted through the tenth pads 630 is changed from a logic "high" level into a logic "low" level, a relatively low PDN impedance condition may be provided to the ground pads. Thus, electric charges in signal lines such as bonding wires may be discharged through the ground pads at substantially the same speed when a level of the digital signals transmitted through the tenth pads 630 is changed from a logic "high" level into a logic "low" level.

Figure 10:
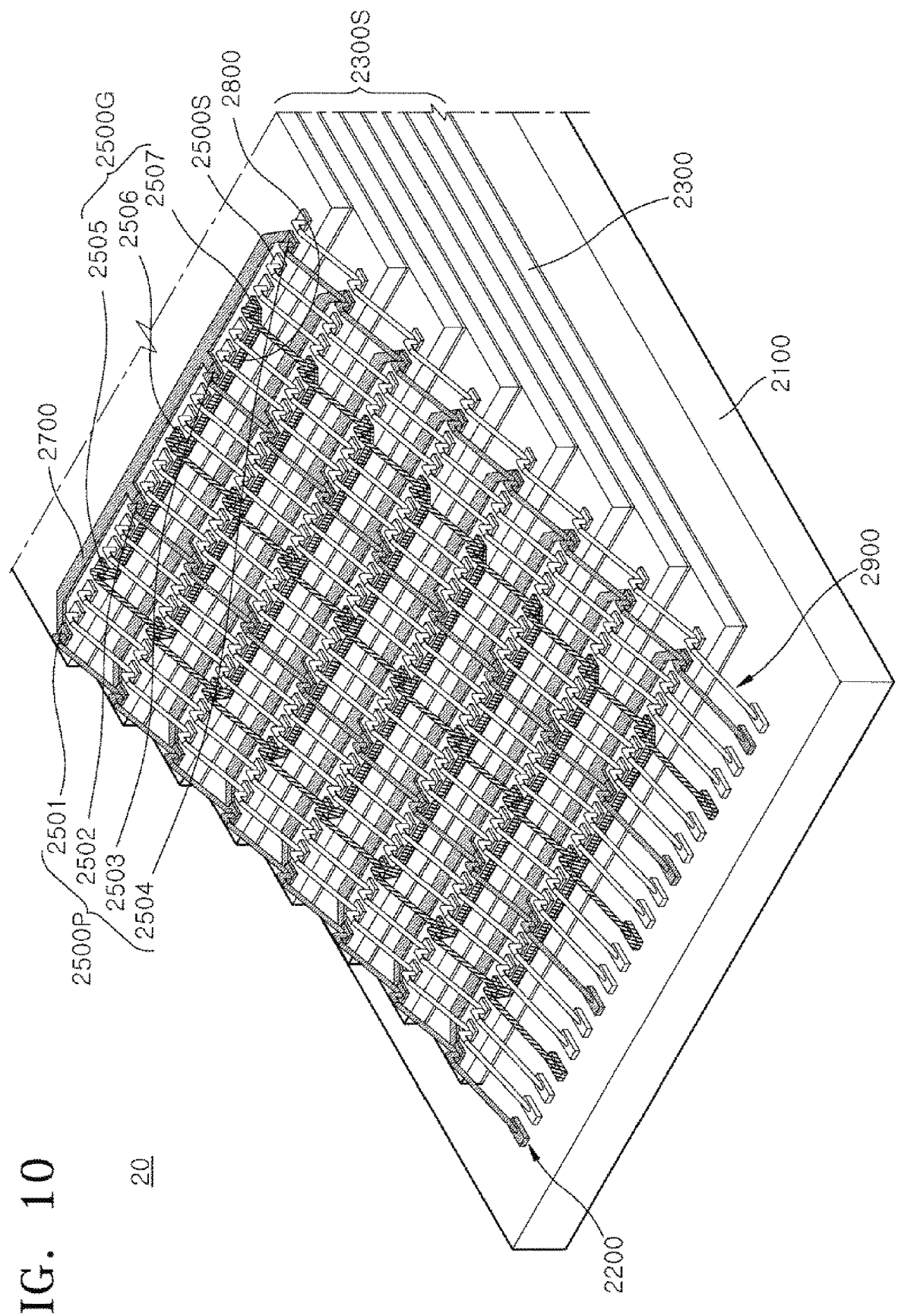
FIG. 10 is a perspective view illustrating a stack package according to an embodiment.

FIG. 10 is a perspective view illustrating a stack package 20 according to an embodiment.

Referring to FIG. 10, the stack package 20 may be configured to include a package substrate 2100, a stack 2300S of semiconductor dies 2300, and interconnectors 2900. The package substrate 2100 may include a plurality of bond fingers 2200. The plurality of semiconductor dies 2300 may be sequentially stacked on the package substrate 2100 to be laterally offset. The interconnectors 2900 may electrically connect the semiconductor dies 2300 to each other and may be bonding wires that electrically connect the semiconductor dies 2300 to the bond fingers 2200 of the package substrate 2100.

Each of the semiconductor dies 2300 may include a plurality of power pads 2500P. The power pads 2500P may include, for example, four power pads (i.e., first to fourth power pads 2501, 2502, 2503 and 2504) which are spaced apart from each other. In some other embodiments, the number of the power pads 2500P may be greater than four.

Ground pads 2500G may be disposed between the power pads 2500P. For example, a first ground pad 2505 of the ground pads 2500G may be disposed between the first and second power pads 2501 and 2502, a second ground pad 2506 of the ground pads 2500G may be disposed between the second and third power pads 2502 and 2503, and a third ground pad 2507 of the ground pads 2500G may be disposed between the third and fourth power pads 2503 and 2504. Signal pads 2500S corresponding to I/O pads may be disposed between the power pads 2500P and the ground pads 2500G. At least one of the signal pads 2500S may be disposed between the power pad 2500P and the ground pad 2500G which are adjacent to each other.

Each of the semiconductor dies 2300 may further include a power redistributed line 2700 that connects the power pads 2500P to each other. The power pads 2500P may have substantially the same potential by the power redistributed line 2700. The power redistributed line 2700 may correspond to a common power line that electrically connects all of the power pads 2500P to each other in each of the semiconductor dies 2300. Each of the semiconductor dies 2300 may further include a ground redistributed line 2800 that connects the ground pads 2500G to each other. The ground pads 2500G may have substantially the same potential by the ground redistributed line 2800. That is, the ground redistributed line 2800 may correspond to a common ground line that electrically connects all of the ground pads 2500G to each other in each of the semiconductor dies 2300.

Any one of the interconnectors 2900 may electrically connect the first power pads 2501, the second power pads 2502, the third power pads 2503 or the fourth power pads 2504 of the semiconductor dies 2300 to each other and may extend to be electrically connected to any one of the bond fingers 2200. The interconnectors 2900 may be bonding wires, each of which electrically connects the pads of the semiconductor dies 2300 to each other.

Figure 11:
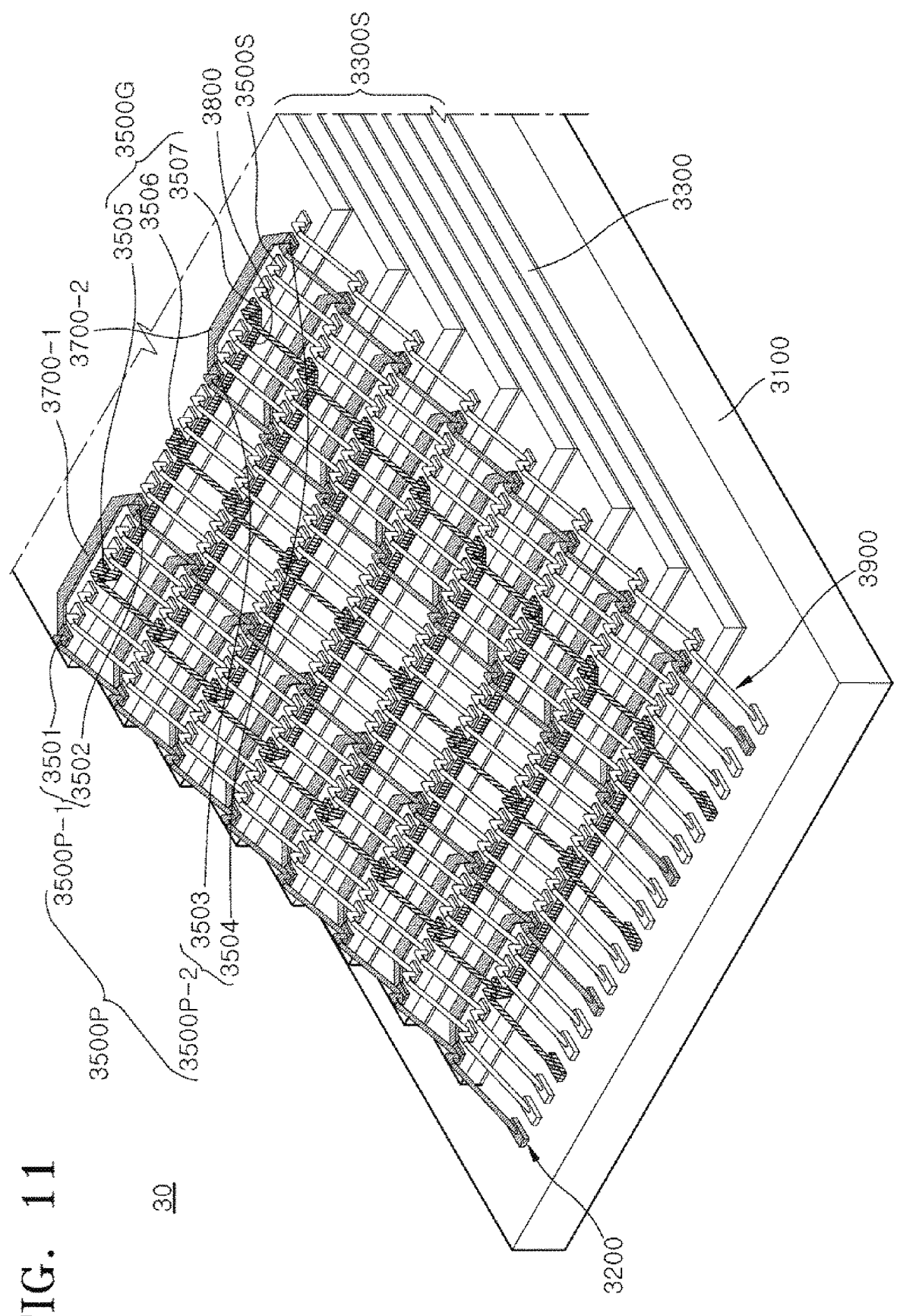
FIG. 11 is a perspective view illustrating a stack package according to an embodiment.

FIG. 11 is a perspective view illustrating a stack package 30 according to an embodiment.

Referring to FIG. 11, the stack package 30 may be configured to include a package substrate 3100, a stack 3300S of semiconductor dies 3300, and interconnectors 3900. The package substrate 3100 may include a plurality of bond fingers 3200. The plurality of semiconductor dies 3300 may be sequentially stacked on the package substrate 3100 to be laterally offset. The interconnectors 3900 may electrically connect the semiconductor dies 3300 to each other and may be bonding wires that electrically connect the semiconductor dies 3300 to the bond fingers 3200 of the package substrate 3100.

Each of the semiconductor dies 3300 may include a plurality of power pads 3500P. The power pads 3500P may be grouped into some groups that have the same number of power pads 3500P. For example, the power pads 3500P may be categorized as either a first group of power pads 3500P-1 including a first power pad 3501 and a second power pad 3502 or a second group of power pads 3500P-2 including a third power pad 3503 and a fourth power pad 3504.

Ground pads 3500G may be disposed between the power pads 3500P. For example, a first ground pad 3505 of the ground pads 3500G may be disposed between the first and second power pads 3501 and 3502, a second ground pad 3506 of the ground pads 3500G may be disposed between the second and third power pads 3502 and 3503, and a third ground pad 3507 of the ground pads 3500G may be disposed between the third and fourth power pads 3503 and 3504.

Signal pads 3500S corresponding to I/O pads may be disposed between the power pads 3500P and the ground pads 3500G. At least one of the signal pads 3500S may be disposed between the power pad 3500P and the ground pad 3500G which are adjacent to each other.

Each of the semiconductor dies 3300 may further include a first power redistributed line 3700-1 that connects some of the power pads 3500P to each other. Each of the semiconductor dies 2300 may further include a second power redistributed line 3700-2 that connects the remaining pads of the power pads 3500P to each other. For example, the first power redistributed line 3700-1 may connect the first and second power pads 3501 and 3502 belonging to the first group of power pads 3500P-1 to each other, and the second power redistributed line 3700-2 may connect the third and fourth power pads 3503 and 3504 belonging to the second group of power pads 3500P-2 to each other. The number of the power pads connected to each other by the second power redistributed line 3700-2 may be equal to the number of the power pads connected to each other by the first power redistributed line 3700-1. Thus, even though the first and second power redistributed lines 3700-1 and 3700-2 are separated from each other, substantially the same PDN impedance condition may be equally provided to all of the power pads 3500P in each of the semiconductor dies 3300.

Each of the semiconductor dies 3300 may further include a ground redistributed line 3800 that connects the ground pads 3500G to each other. That is, the ground redistributed line 3800 may correspond to a common ground line that electrically connects all of the ground pads 3500G to each other in each of the semiconductor dies 3300.

Figure 12:
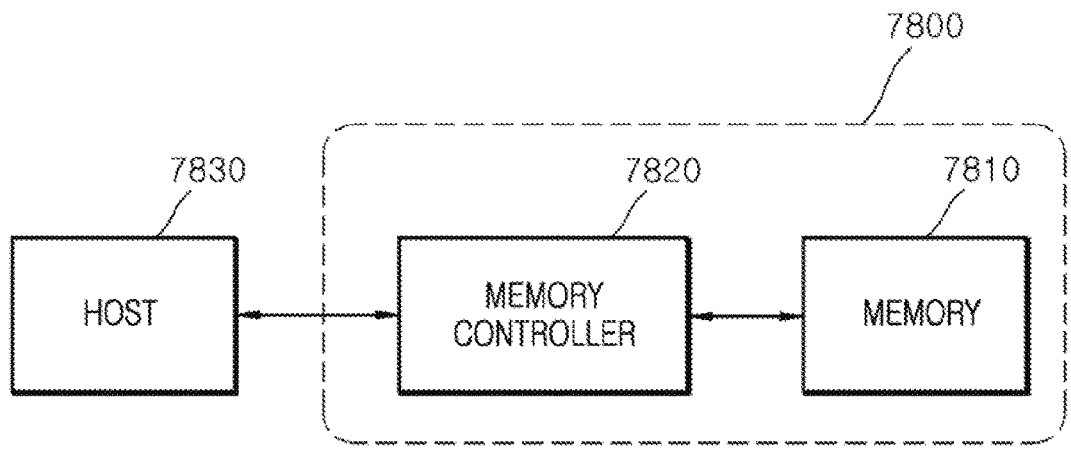
FIG. 12 is a block diagram illustrating an electronic system employing a memory card including at least one of stack packages according to the embodiments.

FIG. 12 is a block diagram illustrating an electronic system including a memory card 7800 employing at least one of the stack packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the stack packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 13:
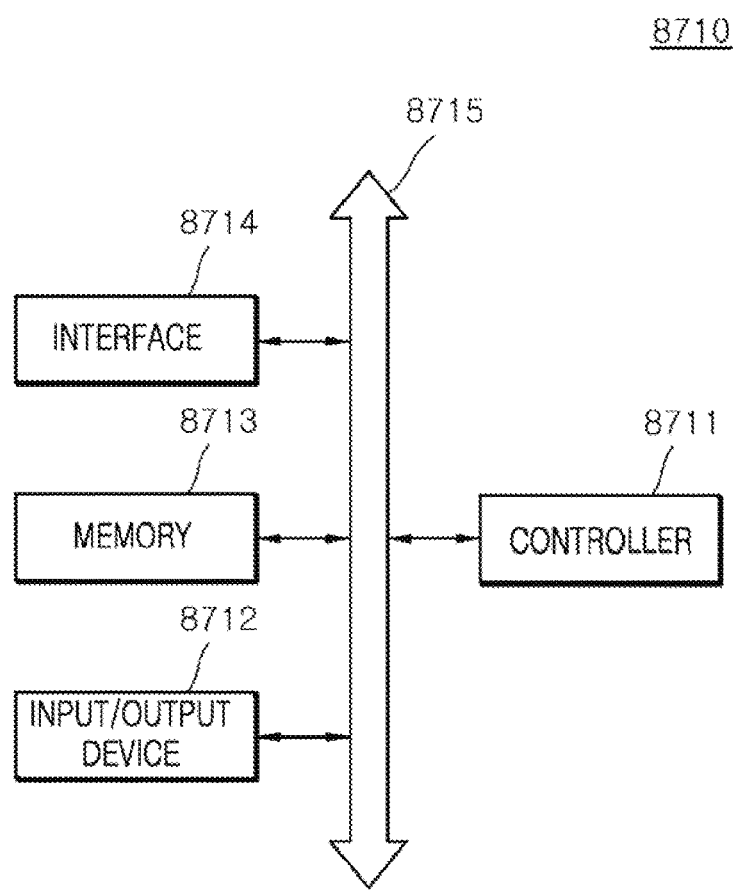
FIG. 13 is a block diagram illustrating another electronic system including at least one of stack packages according to the embodiments.

FIG. 13 is a block diagram illustrating an electronic system 8710 including at least one of the stack packages according to the embodiments. The electronic system 8710 may include a controller 8711, an input/output device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the stack packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:
1. A stack package comprising:
a package substrate including a first bond finger;
a first semiconductor die disposed on the package substrate, the first semiconductor die including a first pad and a second pad which are spaced apart from each other, and a first redistributed line connecting the first and second pads to each other;
a second semiconductor die stacked on the first semiconductor die, the second semiconductor die including a third pad and a fourth pad which are spaced apart from each other, and a second redistributed line connecting the third and fourth pads to each other;
a first interconnector disposed to connect the first and third pads to each other and bonded to the first bond finger; and
a second interconnector connecting the second and fourth pads to each other,
wherein the first bond finger is electrically connected to the third pad through both of a first path and a second path,
wherein the first path comprises the first pad and the first interconnector, and
wherein the second path is branched from the first interconnector and comprises the first redistributed line, the second pad, the second interconnector, the fourth pad and the second redistributed line.
2. The stack package of claim 1,
wherein each of the first and second interconnectors includes a bonding wire;

wherein the package substrate further includes a second bond finger spaced apart from the first bond finger; and
wherein the second interconnector extends to be bonded to the second bond finger.

3. The stack package of claim 2, wherein the first semiconductor die further includes:
a fifth pad disposed between the first pad and the second pad;
a sixth pad located at a side of the second pad opposite to the fifth pad; and
a third redistributed line connecting the fifth and sixth pads to each other.

4. The stack package of claim 3, wherein the second semiconductor die further includes:
a seventh pad disposed between the third pad and the fourth pad;
an eighth pad located at a side of the fourth pad opposite to the seventh pad; and
a fourth redistributed line connecting the seventh and eighth pads to each other.

5. The stack package of claim 4, wherein the package substrate further includes:
a third bond finger disposed between the first bond finger and the second bond finger; and
a fourth bond finger located at a side of the second bond finger opposite to the third bond finger.

6. The stack package of claim 5, further comprising:
a third interconnector disposed to connect the fifth and seventh pads to each other and bonded to the third bond finger; and
a fourth interconnector disposed to connect the sixth and eighth pads to each other and bonded to the fourth bond finger.

7. The stack package of claim 6, wherein the third interconnector is an interconnector supplying a ground voltage to the first and second semiconductor dies.

8. The stack package of claim 3,
wherein the first semiconductor die further includes at least one ninth pad disposed between the second pad and the fifth pad; and
wherein the first redistributed line is disposed to circumvent the at least one ninth pad.

9. The stack package of claim 8, wherein the third redistributed line is located at a side of the at least one ninth pad opposite to the first redistributed line and is disposed to circumvent the at least one ninth pad.

10. The stack package of claim 9,
wherein the first semiconductor die further includes an additional pad spaced apart from the sixth pad; and
wherein the third redistributed line extends to electrically connect the sixth pad to the additional pad.

11. The stack package of claim 9,
wherein the first semiconductor die further includes an additional pad spaced apart from the second pad; and
wherein the first redistributed line extends to electrically connect the second pad to the additional pad.

12. The stack package of claim 1, wherein the first interconnector is an interconnector supplying a power supply voltage to the first and second semiconductor dies.

13. The stack package of claim 1, wherein the second semiconductor die is laterally offset relative to the first semiconductor die to provide a step structure and to reveal the first pad, the second pad, and the first redistributed line.

14. A stack package comprising:
a package substrate including a first bond finger;
a first semiconductor die disposed on the package substrate, wherein the first semiconductor die includes a first pad and a second pad which are spaced apart from each other, a plurality of ninth pads disposed between the first and second pads, and a first redistributed line circumventing the plurality of ninth pads to connect the first and second pads to each other;
a second semiconductor die stacked on the first semiconductor die, wherein the second semiconductor die includes a third pad and a fourth pad which are spaced apart from each other, a plurality of tenth pads disposed between the third and fourth pads, and a second redistributed line circumventing the plurality of tenth pads to connect the third and fourth pads to each other;
a first interconnector disposed to connect the first and third pads to each other and bonded to the first bond finger; and
a second interconnector connecting the second and fourth pads to each other,
wherein the first bond finger is electrically connected to the third pad through both of a first path and a second path,
wherein the first path comprises the first pad and the first interconnector, and
wherein the second path is branched from the first interconnector and comprises the first redistributed line, the second pad, the second interconnector, the fourth pad and the second redistributed line.

15. The stack package of claim 14,
wherein each of the first and second interconnectors includes a bonding wire;
wherein the package substrate further includes a second bond finger spaced apart from the first bond finger and a plurality of fifth bond fingers disposed between the first and second bond fingers; and
wherein the second interconnector extends to be bonded to the second bond finger.

16. The stack package of claim 15, further comprising a plurality of fifth interconnectors connecting the ninth pads and the tenth pads to the fifth bond fingers.

17. The stack package of claim 15, wherein the first semiconductor die further includes:
a fifth pad disposed between two of the ninth pads located between the first pad and the second pad;
a sixth pad located at a side of the second pad opposite to the fifth pad; and
a third redistributed line circumventing the second pad and the ninth pads to connect the fifth and sixth pads to each other.

18. The stack package of claim 17, wherein the second semiconductor die further includes:
a seventh pad disposed between two of the tenth pads located between the third pad and the fourth pad;
an eighth pad located at a side of the fourth pad opposite to the seventh pad; and
a fourth redistributed line circumventing the fourth pad and the tenth pads to connect the seventh and eighth pads to each other.

19. The stack package of claim 18, wherein the package substrate further includes:
a third bond finger disposed between two of the fifth bond fingers located between the first bond finger and the second bond finger; and
a fourth bond finger located at a side of the second bond finger opposite to the third bond finger.

20. The stack package of claim 19, further comprising:
a third interconnector disposed to connect the fifth and seventh pads to each other and bonded to the third bond finger; and a fourth interconnector disposed to connect the sixth and eighth pads to each other and bonded to the fourth bond finger.

21. The stack package of claim 20, wherein the third interconnector is an interconnector supplying a ground voltage to the first and second semiconductor dies.

22. The stack package of claim 14, wherein the first interconnector is an interconnector supplying a power supply voltage to the first and second semiconductor dies.

23. The stack package of claim 14, wherein the second semiconductor die is laterally offset relative to the first semiconductor die to provide a step structure and to reveal the first pad, the second pad, and the first redistributed line.

* * * * *